United States Patent
Joachim et al.

(10) Patent No.: US 6,826,099 B2
(45) Date of Patent: *Nov. 30, 2004

(54) 2T2C SIGNAL MARGIN TEST MODE USING A DEFINED CHARGE AND DISCHARGE OF BL AND /BL

(75) Inventors: Hans-Oliver Joachim, Kanagawa-ken (JP); Thomas Roehr, Kanagawa-ken (JP); Joerg Wohlfahrt, Kanagawa-ken (JP)

(73) Assignee: Infineon Technologies AG, Munich (DE)

( * ) Notice: Subject to any disclaimer, the term of this patent is extended or adjusted under 35 U.S.C. 154(b) by 0 days.

This patent is subject to a terminal disclaimer.

(21) Appl. No.: 10/301,529

(22) Filed: Nov. 20, 2002

(65) Prior Publication Data

US 2004/0095819 A1 May 20, 2004

(51) Int. Cl.[7] .................................................. G11C 7/00
(52) U.S. Cl. ...................... 365/201; 365/145; 365/148; 365/149
(58) Field of Search ................................ 365/201, 145, 365/148, 149

(56) References Cited

U.S. PATENT DOCUMENTS

| | | |
|---|---|---|
| 5,126,740 A | 6/1992 | Kawada |
| 5,265,056 A | 11/1993 | Butler et al. |
| 5,339,273 A | 8/1994 | Taguchi |
| 5,610,867 A | 3/1997 | DeBrosse et al. |
| 6,002,354 A | 12/1999 | Itoh et al. |
| 6,038,160 A * | 3/2000 | Nakane et al. ............... 365/145 |
| 6,522,567 B2 * | 2/2003 | Iwanari ....................... 365/145 |
| 2002/0006053 A1 * | 1/2002 | Murakuki ..................... 365/145 |
| 2002/0008986 A1 * | 1/2002 | Tamura ....................... 365/145 |
| 2002/0093847 A1 | 7/2002 | Yoshihiro |

FOREIGN PATENT DOCUMENTS

| | | |
|---|---|---|
| EP | 0892 408 | 1/1999 |
| EP | 0920 032 | 6/1999 |
| EP | 1087 405 | 3/2001 |
| WO | WO 00/26919 | 5/2000 |

* cited by examiner

*Primary Examiner*—Richard Elms
*Assistant Examiner*—Toan Le
(74) *Attorney, Agent, or Firm*—Fish & Richardson P.C.

(57) ABSTRACT

A semiconductor memory test mode configuration includes a first capacitor for storing digital data. The first capacitor connects a cell plate line to a first bit line through a first select transistor which is activated through a connection to a word line. A second capacitor for storing digital data connects the cell plate line to a second bit line through a second select transistor which is also activated through a connection to the word line. A sense amplifier is connected to the first and second bit lines for measuring a differential read signal on the first and second bit lines. A constant current mover, for example a constant current sink or source, is connected to the first bit line through a third transistor for changing the amount of charge on the first bit line when the third transistor is turned on to reduce the differential read signal.

11 Claims, 3 Drawing Sheets

2T2C SIGNAL MARGIN TEST MODE USING A DEFINED CHARGE AND DISCHARGE OF BL AND /BL

RELATED APPLICATIONS

The present disclosure is related to the following concurrently filed applications, all of which are to be assigned to Toshiba-Infineon and all of which are hereby incorporated by reference in their entirety into the present disclosure: "2T2C Signal Margin Test Mode Using Resistive Element" to Michael Jacob et al., attorney reference number FP1783; "2T2C Signal Margin Test Mode Using Different Pre-Charge Levels for BL and /BL" to Michael Jacob et al., attorney reference number FP 1806; and "2T2C Signal Margin Test Mode Using a Defined Charge Exchange Between BL and /BL" to Hans-Oliver Joachim et al., attorney reference number FP1807.

FIELD OF THE INVENTION

The present invention relates to the implementation of circuits for testing signal margin in memory cells operating in a 2T2C configuration.

BACKGROUND OF THE INVENTION

In semiconductor memories, reliability issues have become more complicated with increasing memory sizes, smaller feature sizes and lower operating voltages. It has become more important to understand the cell signal sensing operation, the signal of memory cells and the limiting factors. One particularly important characteristic in reliability determinations of semiconductor memories is the signal margin. In a 2T2C memory cell configuration, the signal margin is a measure of the zero-versus-one signal measured by the sense amplifier. It is particularly useful to be able to measure the signal margin at product level. The results of product-level signal-margin tests can be used to optimize reliability and as well as the sense amplifier design and the bit line architecture to optimize dynamic memory cell readout. Moreover, a product level test sequence for signal margin can help ensure full product functionality over the entire component lifetime taking all aging effects into account.

Among the more recent semiconductor memories, Ferroelectric Random Access Memories (FeRAMs) have attracted much attention due to their low-voltage and high-speed operation in addition to their non-volatility. FIG. 1 shows a typical prior art FeRAM memory cell in a 2T2C configuration. The 2T2C configuration utilizes two transistors and two capacitors per bit. The 2T2C configuration is beneficial because it allows for noise cancellation between the transistors. Two storage capacitors (Cferro) are connected to a common plate line (PL) on one side and to a pair of bit lines (BL, /BL) on the other side via two select transistors (TS). The two transistors are selected simultaneously by a common word line (WL). A dedicated bit line capacitance (CBL) is connected to each bit line. This bit line capacitance is required for the read operation of the memory cell. The differential read signal on the bit line pair is evaluated in a connected sense amplifier. The polarization is always maintained in directly opposed states in the two storage capacitors of one 2T2C memory configuration.

The signals on the bit lines during a read access are shown in FIG. 4. FIG. 4 of the present disclosure is a plot of the read signals on BL /BL vs. time. In these plots, one of the lines represents the read signal on BL and one represents the read signal on /BL. Which signal is represented by which of the lines depends on whether the read signal on DL or the read signal on /BL is larger. First, both bit lines BL and /BL are pre-charged to the same level (e.g. 0v in the figure). At time t0 the plate is activated and a read signal appears on the bit lines according to the capacitance ratio $C_{ferro}/C_{BL}$. The effective capacitance of a ferroelectric capacitor depends on its polarization state prior to the read operation. At time t1 the full read signals are developed on the two bit lines. At t2 the sense amplifier is activated and the bit line signals are boosted to the full bit line voltages. At t3 the sense amplifier is deactivated and the access cycle ends at t4.

A good solution for determining signal margin in FeRAM memory cells utilizing a single transistor and capacitor (1T1C) is to sweep the reference bit line voltage. A prior art method for determining signal margin in 2T2C FeRAM memory cells is to shift the bit line level by capacitor coupling. However, this method is unsatisfactory because it requires an additional capacitor.

It would therefore be desirable to provide a circuit with a test mode section for facilitating a worst case product test sequence for signal margin. It would also be desirable to design such a circuit for use with semiconductor memories in a 2T2C configuration without requiring additional capacitors in the circuit.

SUMMARY OF THE INVENTION

The present invention provides a test mode section for facilitating a worst case product test sequence for signal margin to ensure full product functionality over the entire component lifetime taking all aging effects into account. The invention works well with semiconductor memories having a 2T2C configuration.

A first aspect of the present invention proposes in general terms a semiconductor memory test mode configuration includes a first capacitor for storing digital data. The first capacitor connects a cell plate line to a first bit line through a first select transistor. The first select transistor is activated through a connection to a word line. A second capacitor for storing digital data connects the cell plate line to a second bit line through a second select transistor. The second select transistor is also activated through a connection to the word line. A sense amplifier is connected to the first and second bit lines for measuring a differential read signal on the first and second bit lines. A constant current mover, for example a constant current sink or source, is connected to the first bit line through a third transistor for changing the amount of charge on the first bit line when the third transistor is turned on to reduce the differential read signal.

Another aspect of the present invention includes a method for testing a semiconductor memory comprising the steps of; pre-charging first and second bit lines; activating a cell plate line to produce a read signal on the first and second bit lines representing digital data stored by a pair of capacitors connected to the cell plate line through first and second transistors; activating a third transistor connected to the first bit line for a time interval to change the amount of charge on the first bit line by moving charge through a constant current mover connected through the third transistor to the first bit line; activating a sense amplifier connected to the first and second bit lines thereby boosting read signals on the first and second bit lines; and determining a reduced differential read signal on the first and second bit lines due to the changed amount of charge on the first bit line.

BRIEF DESCRIPTION OF THE FIGURES

Further preferred features of the invention will now be described for the sake of example only with reference to the following figures, in which.

DETAILED DESCRIPTION OF THE EMBODIMENTS

Figure 1:
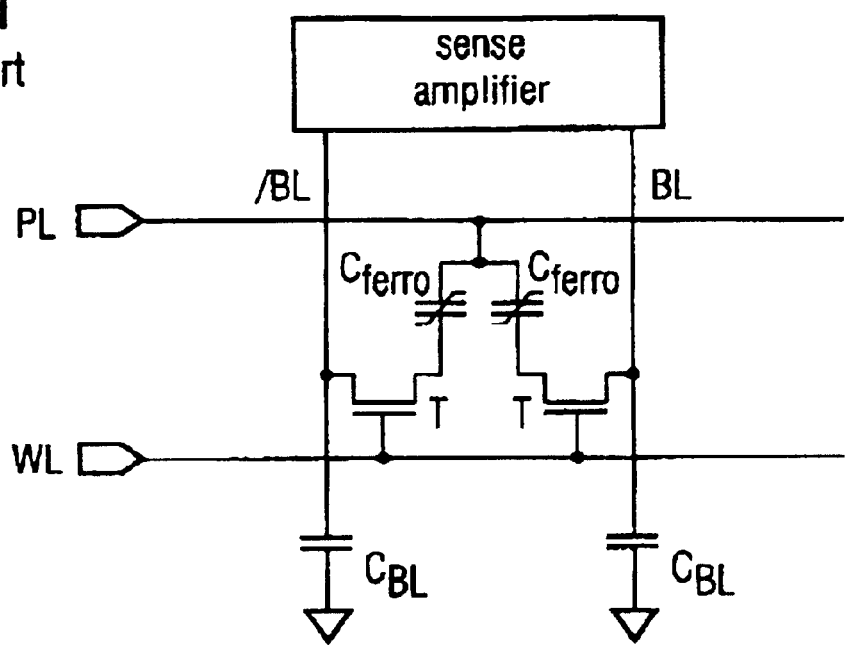
FIG. 1 illustrates a 2T2C memory configuration of the prior art.
Figure 3:
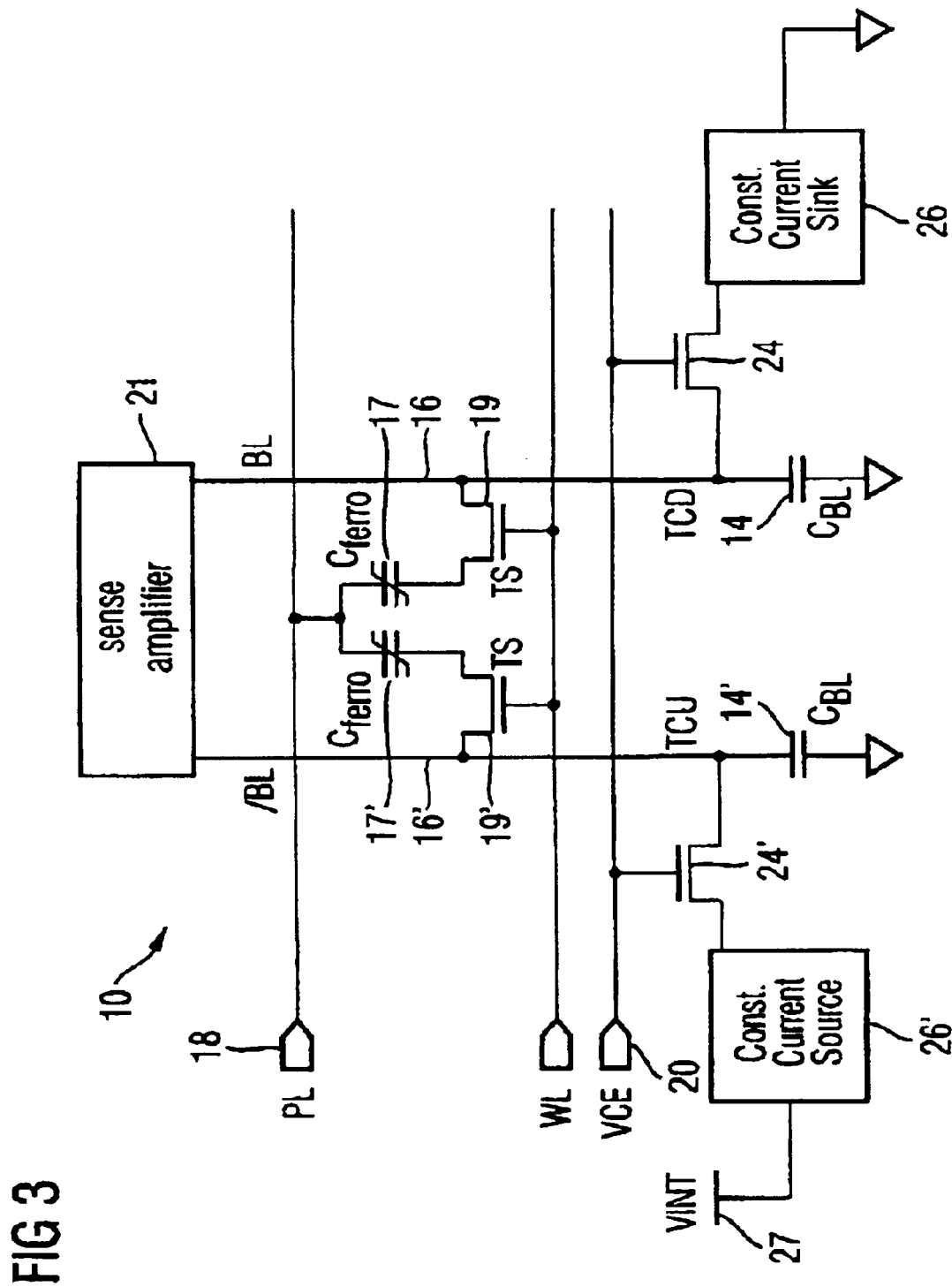
FIG. 3 shows a memory configuration of the present invention having a constant current source and sink connected to the bit lines.
Figure 4:
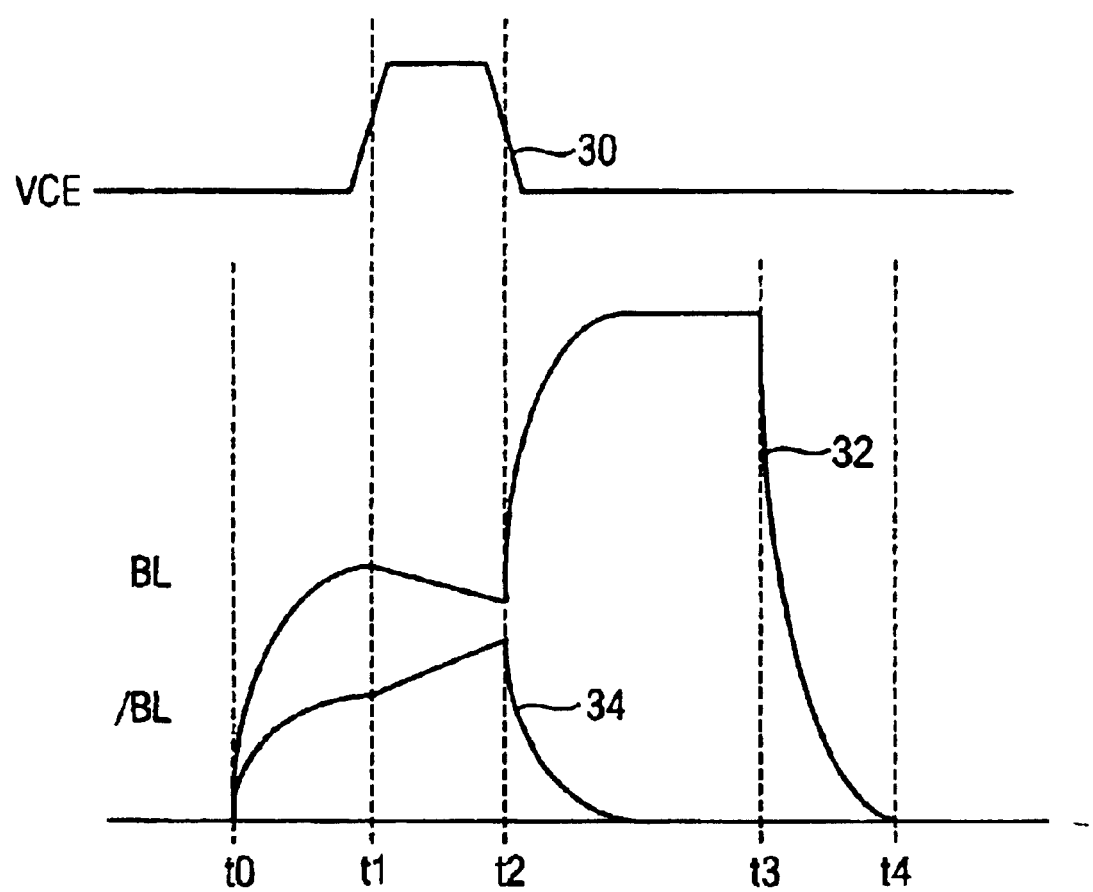
FIG. 4 plots the signals on the bit lines along with the signal VCE during a read access cycle for the circuit of FIG. 3.

FIG. 3 shows a circuit schematic of a memory cell 10 according to the invention. A constant current source 26' is connected in parallel to bit line capacitance 14' and a constant current sink 26 is connected in parallel to bit line capacitance 14. The constant current source 26' and the constant current sink 26 are switchable for bit lines BL 16 and /BL 16' by the signal VCE 20 on transistors TCD 24 and TCU 24'. In another embodiment, only one of the constant current source 26' or the constant current sink 26 is activated. The signal input VCE 20 is kept at non-active (wherein the transistors 24 and 24' are off) during normal operation and the circuit is electrically similar to the circuit shown in FIG. 1. During testing, the signal input VCE 20 can be activated thereby opening a controlled path for charge via the constant current source 26' and the constant current sink 26, thus decreasing the read voltage on the respective bit lines. The higher signal, which is on the bit line /BL 16', is reduced and the lower signal, which is on the bit line BL 16, is increased and the difference between the higher and lower bit line signals becomes smaller for this test. The amount of "signal margin" can be controlled by the time window, during which the transistor TSM 24 is switched on, i.e. between tMon and tMoff.

Figure 2:
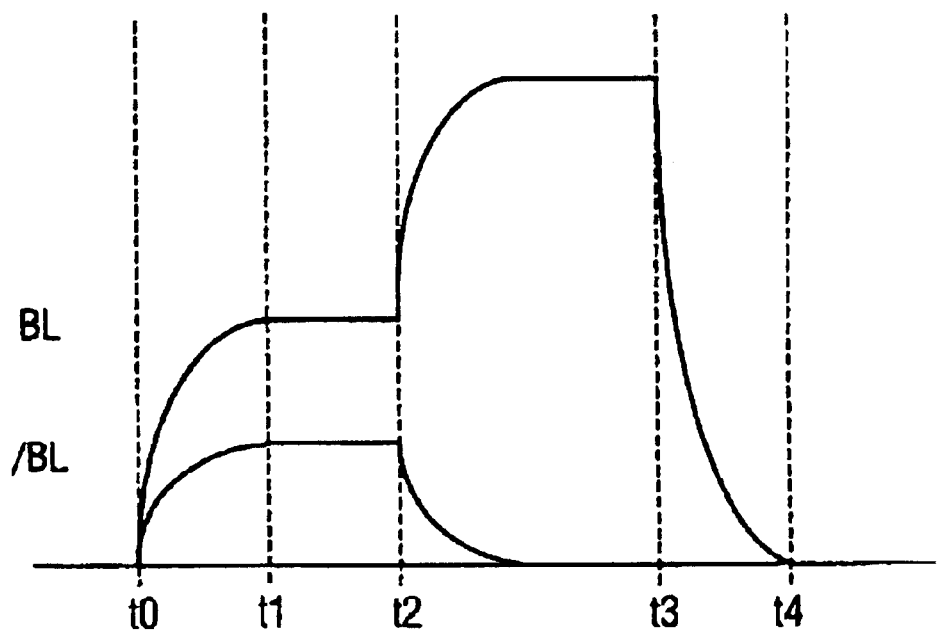
FIG. 2 plots the signals on the bit lines during a read access cycle in the prior art circuit of FIG. 1.

In order to test the memory cell of FIG. 2, data is first written into the memory cell and afterwards the data is read and compared to the expected (i.e. written) data. Thus, during testing it is known which line, BL 16 or /BL 16', should have a lower and which should have a higher signal 2T2C signal margin can be tested by selectively reducing the difference between a "0" signal on one bit line (the bit line /BL 16' in FIG. 3) and a "1" signal on the other bit line (the bit line BL 16 in FIG. 3). In the present invention, a well defined charge of /BL 16' and a discharge of BL 16 is performed after the read signals have developed. A constant current sink 26 connects the bit line BL 16 with ground via a transistor TCD 24, and a constant current source 26' connects the bit line /BL 16' with the supply voltage VINT 27 via transistor TCU 24' (see FIG. 3). When the control signal VCE 20 is activated, a defined amount of charge is taken away from or added to BL and /BL, respectively. This charge amount is defined by the current flow (constant) and the time VCE is active, i.e., it is linearly dependent on time and, therefore, well controllable.

The effect of this test mode is that after signal development on the bit lines (following the activation of a common plate line PL 18 and just before sense amplifier 21 activation) the difference between the "0" signal on the bit line /BL 16' (see FIG. 3) and the "1" signal on the bit line BL 16 (again, see FIG. 3) is smaller than in the normal read operation. The result of this test mode is a reduced differential read signal (i.e. the difference between the two bit-line signals) which tightens the margin for a save operation of the chip (the worst case test condition).

In this example, the bit line /BL 16' is assumed to be the bit line with the lower read signal. The bit lines BL 16 and /BL 16' are pre-charged to a certain level (e.g. 0V in the figure) and at time t0 the common plate line (PL) 18 is activated and a read signal appears on the bit lines according to the capacitance ratio Cferro/CBL. Here, Cferro is the capacitance of storage capacitors Cferro 17 and Cferro 17' which are connected to the plate 18 on one side and to the pair of bit lines (BL 16, /BL 16') on the other side via two select transistors (TS) 19, 19'. CBL is the capacitance of dedicated bit line capacitances (CBL) 14, 14' connected to each bit line. At time t1 the full read signals are developed on the two bit lines 16, 16'. The signal VCE 30 is activated switching on the transistors TCD 24 and TCU 24' for removing charge from and adding charge to the bit lines BL 16 and /BL 16', respectively. The signal VCE 30 can be, in general, activated during the time after signal development on the bit lines (soon after activation of a common plate line PL 18) and can be deactivated just before sense amplifier 21 activation. However, there is no limitation on the activation period for the signal VCE 30. The activation period of the signal VCE 30 and the corresponding on-time of the transistors TCD 24 and TCU 24' should at least partially overlap the period of time between activation of the common plate line PL 18 at time t0 and the sense amplifier 21 activation time t2. The charge on the bit line with the higher read signal is decreased while the charge on the bit line with the lower read signal is increased resulting in a decreased signal on this bit lines at t2 when a sense amplifier 21 is activated and the bit line signals are boosted to the full bit line voltages. As a result, the differential read signal, i.e. the difference between the two bit-line signals, is decreased accordingly, which tightens the margin for a save operation of the chip (the worst case test condition). At t3 the sense amplifier is deactivated and the access cycle ends at t4.

In all of the above embodiments the described components, including the current sources and sinks and the transistors TSM 24, 24', can be formed on the same die. Also, the term "connected" as used in the present disclosure does not imply that connected components must be in direct physical contact. Rather, the components need only be electrically connected.

One example of the procedure to test for the analog value of the signal margin is illustrated by the following steps:

1. Write data to and then read data from the memory cell in normal operation (without activating the transistors TSM 24 or 24') If the differential read signal is too small, then a comparison of the read data with the write data fails, thereby indicating that the circuit has no signal margin. If the differential read signal is sufficiently large then step 2 is performed.

2. Write data to and then read data from the memory cell with the time window of the transistors 24 or 24' set to a small value signal margin (SM0) to drain some of the charge from or add charge to the bit lines. If the differential read signal is too small, then a comparison of the read data with the write data fails, thereby indicating that the circuit has no signal margin. If the differential read signal is sufficiently large then step 3 is performed.

3. Write data to and then read data from the memory cell with the time window of the transistors 24 or 24' set to a slightly larger value corresponding to first signal margin (SM1) to drain some of the charge from or add charge to the bit lines. If the differential read signal is too small, then a comparison of the read data with the write data fails, thereby indicating that the circuit has a signal margin corresponding to SM0. If the differential read signal is sufficiently large then step 4 is performed.

4. Write data to and then read data from the memory cell with the time window of the transistors 24 or 24' set to an even larger value corresponding to second signal margin (SM2) to drain more of the charge from or add charge to the bit lines. If the differential read signal is too small, then a comparison of the read data with the write data fails, thereby indicating that the circuit has a signal margin corresponding to SM1. If the differential read signal is sufficiently large then the test is continued until the failure of the comparison.

In an alternative embodiment, the potential VCE 20 for controlling the charge/discharge process is generated chip internally (on the same chip) or is provided externally.

The control signal VCE 20 can be separated into VCED for turning on the transistor TCD 24 and into VCEU for turning on the transistor TCU 24'. By doing so, charging of /BL and discharging of BL can be performed separately. Alternately, the only a constant current source or a constant current sink, without using the other one, can be used to reduce the differential read signal.

Thus, although the invention has been described above using particular embodiments, many variations are possible within the scope of the claims, as will be clear to a skilled reader.

We claim:

1. A semiconductor memory test mode configuration, comprising: a first capacitor for storing digital data connecting a cell plate line to a first bit line through a first select transistor, the first select transistor activated through a connection to a word line; a second capacitor for storing digital data connecting the cell plate line to a second bit line through a second select transistor, the second select transistor activated through a connection to the word line; & sense amplifier connected to the first and second bit lines for measuring a differential read signal on the first and second bit lines; and a constant current mover connected to the first bit line through a third transistor for changing the amount of charge on the first bit line when the third transistor is turned on to reduce the differential read signal.

2. The semiconductor memory test mode configuration of claim 1, wherein the first bit line has a higher read signal than the second bit line and the constant current mover is a constant current sink for removing charge from the first bit line at a relatively constant rate.

3. The semiconductor memory test mode configuration of claim 1, wherein the first bit line has a lower read signal than the second bit line the constant current mover is a constant current source for adding charge to the first bit line at a relatively constant rate.

4. The semiconductor memory test mode configuration of claim 1, wherein the first bit line has a higher read signal than the second bit line and the constant current mover is a constant current mink for removing charge from the first bit line at a relatively constant rate and further comprising a constant current source connected to the second bit line through a fourth transistor for adding charge to the second bit line at a constant rate.

5. The semiconductor memory test mode configuration of claim 2, wherein the constant current mover moves charge on the first bit line in response to a signal applied to the third transistor and wherein the signal is applied for a time interval overlapping the time interval between activating a memory cell plate line and activating the sense amplifier.

6. The semiconductor memory test mode configuration of claim 1, wherein the first and second select transistors are Ferroelectric Random Access Memories.

7. The semiconductor memory test mode of claim 1, wherein the first and second capacitors are ferroelectric capacitors.

8. The semiconductor memory test mode of claim 4, further comprising a bit line capacitor connected between the fourth transistor and ground in parallel with the constant current sink.

9. A method for testing a semiconductor memory comprising the steps of: pre-charging first and second bit lines; activating a cell plate line to produce a read signal on the first and second bit lines representing digital data stored by a pair of capacitors connected to the cell plate line through first and second transistors; activating a third transistor connected to the first bit line for a time interval to change the amount of charge on the first bit line by moving charge through a constant current mover connected through the third transistor to the first bit line; activating a sense amplifier connected to the first and second bit lines thereby boosting read signals on the first and second bit lines; and determining a reduced differential read signal on the first and second bit lines due to the changed amount of charge on the first bit line.

10. The method for testing a semiconductor memory of claim 9, further comprising the step of activating a fourth transistor connected to the second bit line for a time interval to change the amount of charge on the second bit line by moving charge through an additional constant current mover connected through the fourth transistor to the second bit line.

11. The method for testing a semiconductor memory of claim 10, wherein the constant current mover and additional constant current mover are a constant current source and a constant current sink.

* * * * *